(12) United States Patent
Kinoshita et al.

(10) Patent No.: US 8,773,627 B2
(45) Date of Patent: Jul. 8, 2014

(54) LIQUID CRYSTAL DISPLAY DEVICE AND METHOD FOR MANUFACTURING LIQUID CRYSTAL DISPLAY DEVICE

(75) Inventors: Takuo Kinoshita, Tottori (JP); Hiroyuki Ito, Tottori (JP)

(73) Assignee: Japan Display West Inc., Chita-gun, Aichi-ken (JP)

( * ) Notice: Subject to any disclaimer, the term of this patent is extended or adjusted under 35 U.S.C. 154(b) by 83 days.

(21) Appl. No.: 13/269,057

(22) Filed: Oct. 7, 2011

(65) Prior Publication Data

US 2013/0088677 A1    Apr. 11, 2013

(51) Int. Cl.
*G02F 1/1333* (2006.01)
(52) U.S. Cl.
USPC .......................................................... 349/138
(58) Field of Classification Search
CPC .............. G02F 2001/136286; G02F 1/136286; G02F 1/0356; G02F 1/05; G02F 1/13439; G02F 1/2255; G02F 1/3134; G02F 2001/13629
USPC ............................................ 349/139, 138, 54
See application file for complete search history.

(56) References Cited

U.S. PATENT DOCUMENTS

| 6,741,312 B2* | 5/2004 | Komatsu ........................ 349/141 |
| 7,636,144 B2* | 12/2009 | Horiguchi et al. ............ 349/141 |
| 8,018,565 B2* | 9/2011 | Horiguchi et al. ............ 349/141 |
| 8,222,096 B2* | 7/2012 | Nomoto ......................... 438/158 |
| 2001/0030717 A1 | 10/2001 | Kaneko et al. |
| 2002/0196383 A1* | 12/2002 | Chae ................................ 349/43 |
| 2003/0075733 A1* | 4/2003 | Yamazaki et al. ............ 257/200 |
| 2005/0030463 A1 | 2/2005 | Kaneko et al. |
| 2005/0092991 A1* | 5/2005 | Ahn et al. ........................ 257/59 |
| 2005/0110932 A1* | 5/2005 | Chang et al. .................. 349/141 |
| 2005/0168664 A1* | 8/2005 | Chae et al. ....................... 349/38 |
| 2005/0206825 A1 | 9/2005 | Kaneko et al. |
| 2007/0002252 A1 | 1/2007 | Kaneko et al. |
| 2007/0182905 A1 | 8/2007 | Kaneko et al. |
| 2008/0012808 A1 | 1/2008 | Kurahashi et al. |
| 2008/0068539 A1 | 3/2008 | Kaneko et al. |

(Continued)

FOREIGN PATENT DOCUMENTS

| JP | 06-112333 | 4/1994 |
| JP | 2000-315683 | 11/2000 |

(Continued)

OTHER PUBLICATIONS

Japanese Office Action issued Apr. 16, 2013 in a corresponding Japanese Patent Application.

*Primary Examiner* — Kaveh Kianni
(74) *Attorney, Agent, or Firm* — K&L Gates LLP

(57) ABSTRACT

A liquid crystal display device includes a pair of substrates of which one substrate is provided with a plurality of scanning lines and a plurality of common wirings, a first insulation film covering the scanning lines, the common wirings, and the one substrate, a plurality of signal lines provided on the first insulation film, a thin film transistor provided near an intersection part of the scanning lines and the signal lines, a lower electrode formed below the first insulation film and connected to the common wirings, a second insulation film formed on surfaces of the thin film transistor, the signal lines, and the first insulation film, and an upper electrode formed on the second insulation film and having a slit, a display region in which the liquid crystal layer is driven by an electric field, and a non-display region that is formed outside the display region.

4 Claims, 8 Drawing Sheets

(56) References Cited

U.S. PATENT DOCUMENTS

| | | | |
|---|---|---|---|
| 2008/0180622 A1* | 7/2008 | Horiguchi et al. | 349/139 |
| 2009/0002294 A1* | 1/2009 | Horiguchi et al. | 345/87 |
| 2009/0086143 A1* | 4/2009 | Kaneko et al. | 349/139 |
| 2009/0174852 A1* | 7/2009 | Watanabe et al. | 349/138 |
| 2009/0316100 A1* | 12/2009 | Sato | 349/143 |
| 2010/0165224 A1* | 7/2010 | Ahn et al. | 349/38 |
| 2012/0113372 A1* | 5/2012 | Kato et al. | 349/138 |
| 2013/0083279 A1* | 4/2013 | Kinoshita et al. | 349/138 |
| 2013/0088677 A1* | 4/2013 | Kinoshita et al. | 349/138 |
| 2013/0182210 A1* | 7/2013 | Koh et al. | 349/141 |

FOREIGN PATENT DOCUMENTS

| | | |
|---|---|---|
| JP | 2001-142092 | 5/2001 |
| JP | 2001-194676 | 7/2001 |
| JP | 2008-020660 | 1/2008 |
| JP | 2008-096960 | 4/2008 |
| JP | 2008-310210 | 12/2008 |
| JP | 2009-075839 | 9/2011 |

* cited by examiner

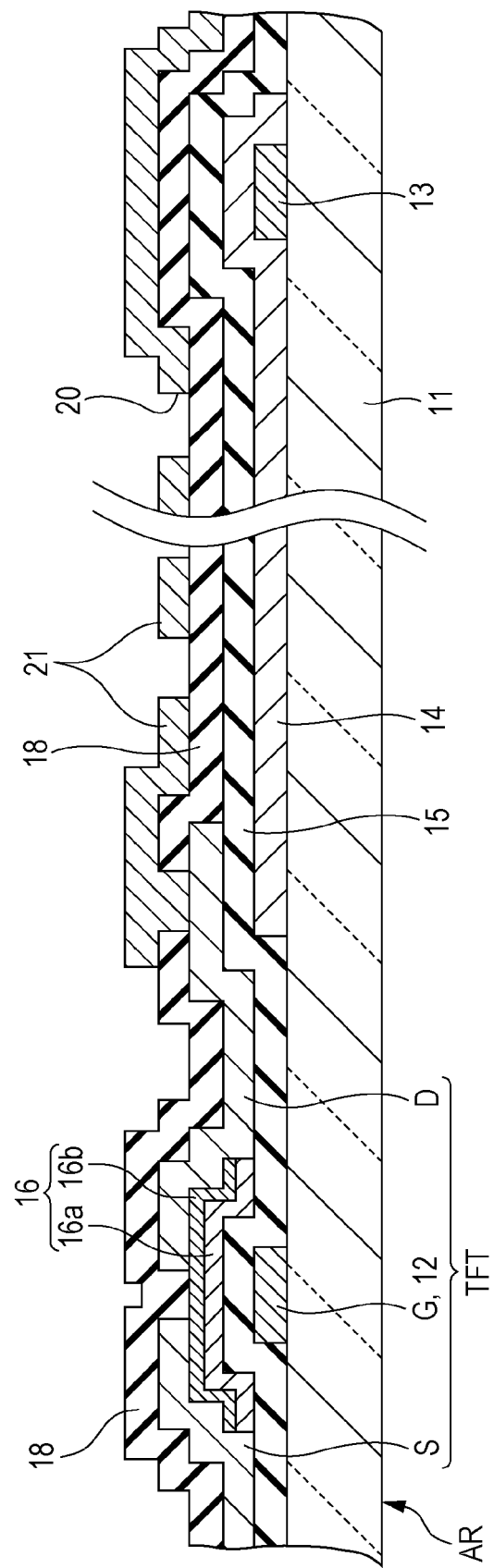

LIQUID CRYSTAL DISPLAY DEVICE AND METHOD FOR MANUFACTURING LIQUID CRYSTAL DISPLAY DEVICE

CROSS REFERENCES TO RELATED APPLICATIONS

The present application contains subject matter relating Japanese Priority Patent Application JP 2009-075839 filed in the Japan Patent Office on Mar. 26, 2009, the entire contents of which are hereby incorporated by reference.

BACKGROUND

The present application relates to a liquid crystal display device of a fringe field switching (referred to below as FFS) mode. Especially, the present technology relates to a liquid crystal display device of the FFS mode in which short-circuiting between a signal line and a common electrode (also referred to below as a lower electrode) is suppressed.

Examples of liquid crystal display devices employing a lateral electric field system include a liquid crystal display device of the FFS mode in which a pair of electrodes which are a pixel electrode and a common electrode is provided only on one substrate. In the liquid crystal display device of the FFS mode, the pixel electrode and the common electrode which are used for applying an electric field to a liquid crystal layer are respectively disposed on different layers with an insulation film interposed. The liquid crystal display device of the FFS mode has a wide visual angle, high contrast capability, and higher transmittance and can be driven by low voltage, being able to perform bright display. In addition, the liquid crystal display device of the FFS mode has a large overlapping area of the pixel electrode and the common electrode when viewed from above so as to have such advantage that larger storage capacitance is additionally produced and therefore provision of a separate auxiliary capacitance electrode is not demanded.

However, in manufacturing of a liquid crystal display device, physical vapor deposition such as vacuum vapor deposition and sputtering or organometallic chemical vapor deposition by thermal decomposition has been employed as a deposition method in the related art. Therefore, in such liquid crystal display device of the FFS mode, a step is formed on a position on which a signal line and a common wiring intersect with each other due to lamination of the signal line and the common wiring, and the film thickness of a lateral surface region of the step decreases so as to more likely cause decrease of dielectric pressure. Accordingly, failures such as disconnecting and short-circuiting have sometimes appeared. In the liquid crystal display device of the FFS mode of the related art, a surface of the common wiring is covered by a lower electrode, a surface of the lower electrode is covered by a gate insulation film, a signal line is formed on a surface of the gate insulation film, and a thin film transistor TFT serving as a switching element is formed near an intersection part of a scanning line and the signal line. Therefore, in the manufacturing, after an amorphous silicon (a-Si) layer and an n+a-Si layer, for example, are formed on the whole surface of the gate insulation film, patterning is performed to form a semiconductor film for forming a TFT by photolithography. At this time, before the a-Si layer and the n+a-Si layer are patterned by the photolithography, there is a cleaning process by using pure water. In the cleaning, static electricity is generated between the pure water and the n+a-Si layer, and spark is generated between the n+a-Si layer and the common wiring due to the static electricity, so that dielectric breakdown may occur in a first insulation film which is interposed between n+a-Si layer and the lower electrode.

In formation of a metallic film on a formed fine step in a semiconductor substrate, a ratio between the film thickness in a lateral surface region of the step and the film thickness in a flat part around the step is called step coverage. When the film thickness in the flat part around the step is denoted as A and the film thickness in the lateral surface region of the step is denoted as B, the step coverage is expressed as B/A. As this value becomes larger than 1, the coverage property becomes better, while as this value becomes smaller than 1, the coverage property becomes poorer. When the film thickness of the lateral surface region of the step is smaller than the film thickness in the flat part around the step, the coverage property is poor, easily causing fine holes or cracks in the lateral surface region of the step.

If a signal line, a source electrode, a drain electrode, and the like are patterned after a source layer is formed on a surface of the first insulation film in this state, the source layer enters a broken part of a gate insulation film. Accordingly, the signal line and the lower electrode short-circuit, sometimes exhibiting a line defect. Such phenomenon occurs because the thickness of the gate insulation film covering lateral surfaces of the common wiring and the lower electrode is small. The small thickness is caused by the large step formed by the common wiring and the lower electrode and the poor step coverage of the gate insulation film covering the common wiring and the lower electrode. Causes that the step formed by the common wiring and the lower electrode becomes large are the following: the lateral surface is formed on the same position of the lateral surface of the common wiring so as to prevent the lower electrode from protruding to the scanning line side (1) because a common wiring is shifted and disposed to a side of one of the scanning lines adjacent to the region in which this common wiring is provided, so as to improve aperture ratio and display image quality, and (2) because a contact area between the common wiring and the lower electrode should be enlarged as much as possible so as to reduce contact resistance between the common wiring and the lower electrode.

For such problem, Japanese Unexamined Patent Application Publication No. 6-112333 discloses a semiconductor device that can secure sufficient dielectric breakdown strength against static electricity by doubling an insulation film. In the semiconductor device disclosed in Japanese Unexamined Patent Application Publication No. 6-112333, the insulation film has the double-layer configuration which is composed of a first insulation film which is a silicon oxide film or a silicon nitride film and a second insulation film made of a heat-resistant organic material. Further, the second insulation film is formed by depositing a liquid substance having a large viscosity, so that a corner of the second insulation film does not have a cliff shape but has a loose shape and thus the film edge part becomes loose to have a gentle slope shape (taper shape). Therefore, the film thickness of the insulation film can be increased compared to the related art, being able to secure sufficient dielectric breakdown strength against static electricity.

SUMMARY

However, in the method that sufficient film thickness is obtained by forming the insulation film to have the edge part having the slope shape as the semiconductor device disclosed in Japanese Unexamined Patent Application Publication No. 6-112333, even though the edge part of the insulation film is formed to have the slope shape and the step coverage is improved, the film thickness of the insulation film formed on the upper part side of the edge part of the lower electrode remains smaller than the flat part. Thus, it is difficult to secure sufficient film thickness over the whole insulation film. Therefore, in the semiconductor device disclosed in Japanese Unexamined Patent Application Publication No. 6-112333 as well, electrostatic breakdown may locally occur on a part having the smaller thickness and formed on the upper side of the slope-shaped edge part of the lower electrode due to an electric field generated between the static electricity generated in the cleaning and the lower electrode.

After a great deal of consideration to deal with the above-mentioned problems of the related art, the inventors found that insufficient formation of the film thickness of an edge part could be dissolved in forming a CVD of a first insulation film by extending a lower electrode which is formed on a common wiring which is an origin of an occurrence of spark and thus forming a plurality of steps. It is desirable to provide a highly reliable liquid crystal display device of the FFS mode in which short-circuiting between a lower electrode and a signal line is suppressed and an occurrence of a line defect is reduced.

Further, it is desirable to provide a method for manufacturing a liquid crystal display device of the FFS mode which exhibits the above-described advantageous effects.

According to an embodiment, there is provided a liquid crystal display device including a pair of substrates that sandwich and hold a liquid crystal layer and of which one substrate is provided with a plurality of scanning lines and a plurality of common wirings that are provided parallel with each other, a first insulation film that covers the scanning lines, the common wirings, and the one substrate, a plurality of signal lines that are provided on the first insulation film in a direction intersecting with the scanning lines and the common wirings, a thin film transistor that is provided near an intersection part of the scanning lines and the signal lines, a lower electrode that is formed below the first insulation film and is connected to the common wirings, a second insulation film that is formed on surfaces of the thin film transistor, the signal lines, and the first insulation film, and an upper electrode that is formed on the second insulation film to overlap with the lower electrode when viewed from above and has a slit, a display region in which the liquid crystal layer is driven by an electric field generated between the lower electrode and the upper electrode, and a non-display region that is formed outside the display region. In the liquid crystal display device, each of the common wirings is provided in a manner to be shifted on a side of one of the scanning lines that are adjacent to a region in which the common wiring is provided, and the lower electrode covers the common wirings in a manner that a plurality of steps are formed on at least one lateral surface of the common wiring.

The liquid crystal display device of the embodiment includes a pair of substrates that sandwich and hold a liquid crystal layer and of which one substrate is provided with a plurality of scanning lines and a plurality of common wirings that are provided parallel with each other, a first insulation film that covers the scanning lines, the common wirings, and the one substrate which is exposed, a plurality of signal lines that are provided on the first insulation film in a direction intersecting with the scanning lines and the common wirings, a thin film transistor (TFT) that is provided near an intersection part of the scanning lines and the signal lines, a lower electrode that is made of a transparent conductive material, is formed below the first insulation film in every region partitioned by the plurality of scanning lines and the signal lines, and is connected to the common wirings, a second insulation film that is formed on surfaces of the thin film transistor and its electrode, the signal lines, and the first insulation film which is exposed, and an upper electrode that is made of a transparent conductive material, is formed on the second insulation film to overlap with the lower electrode when viewed from above, and has a plurality of slits which are provided to be parallel with each other. Accordingly, the liquid crystal display device of the embodiment operates as a liquid crystal display device of the FFS mode. Here, the lower electrode serves as a common electrode and the upper electrode serves as a pixel electrode.

In the liquid crystal display device of the embodiment, the lower electrode is formed to cover the common wiring in a manner that a step is formed on the lateral surface of the common wiring. Thus, a plurality of steps is formed on the common wirings and the lower electrode. With such configuration, even though surfaces of these layers are covered by the first insulation film, the thickness reduction of the first insulation film is suppressed because individual steps are small. Accordingly, above-described dielectric breakdown of the first insulation film caused by static electricity in a manufacturing process such as cleaning is suppressed. According to the liquid crystal display device of the embodiment, short-circuiting between the signal line and the common wiring is suppressed, so that a liquid crystal display device in which an occurrence of a line defect is reduced can be provided.

Further, in the liquid crystal display device of the embodiment, the lower electrode covers the surface of the common wiring disposed between lower electrodes. It is commonly sufficient that the lower electrode is formed in every region partitioned by the plurality of scanning lines and the signal lines. If the lower electrode covers also the surface of the common wiring disposed between the lower electrodes, no step is generated on the first insulation film on both sides of the signal lines on a part on which the signal lines and the common wirings intersect with each other. Therefore, dielectric breakdown of the first insulation film caused by static electricity generated in the cleaning can be further suppressed.

Further, in the liquid crystal display device of the embodiment, the common wiring is provided in a manner to be shifted to a side of one of the scanning lines that are adjacent to the pixel region in which this common wiring is provided. With such configuration, the common wiring is not positioned on the center of one pixel, increasing an aperture ratio. Further, one pixel is not divided into two regions by the common wiring, improving display image quality.

In the liquid crystal display device of the embodiment, it is preferable that a width of a step part of the lower electrode be 2.25 μm or more from the lateral surface of the common wirings.

The thickness of the scanning line and the thickness of the common wiring are approximately 0.2 μm, the thickness of the lower electrode is approximately 0.1 μm, and the thickness of the first insulation film which is also called a gate insulation film is commonly approximately 0.4 μm. Therefore, by setting the width of the step part of the lower electrode to be 2.25 μm or more from the lateral surface of the common wiring, even if variety of the line width of the signal lines or pattern misalignment is taken into consideration, the first insulation film which is formed on the lower electrode can be set to have the thickness by which dielectric breakdown caused by static electricity can be sufficiently suppressed on the lateral surface of the step part as well. According to the liquid crystal display device of the embodiment, a liquid crystal display device in which short-circuiting between the signal lines and the common wirings can be further suppressed and an occurrence of a line defect is reduced can be provided. If the width of the step of the lower electrode is less than 2.25 μm, short-circuiting between the lower electrode and the signal lines more frequently occurs disadvantageously.

In the liquid crystal display device of the embodiment, it is preferable that the step part of the lower electrode be formed only near a position on which the common wirings and the signal lines intersect with each other.

The embodiment is intended to prevent short-circuiting between the lower electrode and the signal lines, so that it is sufficient that the step part of the lower electrode is formed only on a part on which the common wirings and the signal lines intersect with each other. According to the liquid crystal display device of the embodiment, a liquid crystal display device in which an occurrence of a line defect is suppressed, the aperture ratio is large, and display image quality is superior can be provided.

In the liquid crystal display device of the embodiment, it is preferable that the first insulation film be formed such that when a thickness of an insulation film formed on a flat part on the lower electrode is denoted as A and a thickness of an insulation film formed on a lateral surface of the steps of the lower electrode is denoted as B, a step coverage of the first insulation film satisfy a relationship of $B/A \geq 1$.

If the step coverage of the first insulation film is set to satisfy the relationship of $B/A \geq 1$, it can be determined that the film thickness of the lateral surface region of the step is sufficiently large compared to the film thickness in the flat part around the step and the coverage property is superior, being able to impart sufficient dielectric pressure to the first insulation film. Therefore, according to the liquid crystal display device of the embodiment, the dielectric strength of the first insulation film can be increased, so that a liquid crystal display device in which short-circuiting between the signal lines and the common wirings can be further suppressed and an occurrence of a line defect is reduced can be provided. If the step coverage is expressed as $B/A \leq 1$, the film thickness of the lateral surface region of the step is small compared to the film thickness of the flat part around the step. Therefore, fine holes or cracks are easily generated in the lateral surface region of the step and short-circuiting between the lower electrode and the signal lines more frequently occurs disadvantageously.

In the liquid crystal display device of the embodiment, it is preferable that a dummy pixel be formed in the non-display region, and the step part of the lower electrode be formed in the dummy pixel.

The dummy pixel region is formed in a region adjacent to the display region, that is, the dummy pixel region is a region which does not contribute to actual display. However, thanks to the provision of the dummy pixel, the film thickness of each layer in the display region and the film thickness of each layer in the dummy pixels can be set to be same as each other. Therefore, adverse affect caused by adjacency with the non-display region is less imparted to display image quality of pixels in a peripheral part of the display region. Further, the dummy pixel is formed in the periphery of the display region, so that the dummy pixel can absorb stress from outside such as static electricity and can suppress an occurrence of defects in pixels within the display region. According to the liquid crystal display device of the embodiment, short-circuiting between the signal lines and the common wirings can be suppressed in the dummy pixel as well, so that a highly reliable liquid crystal display device in which defects of display pixels in the display region are suppressed by appropriate performance of the dummy pixel can be provided.

A method for manufacturing a liquid crystal display device according to another embodiment includes (1) covering a whole surface of a transparent substrate by a conductive layer and etching the conductive layer so as to pattern a plurality of scanning lines having a gate electrode part and a plurality of common wirings in parallel with each other, (2) covering a whole surface of a substrate obtained in the process (1) by a transparent conductive layer and patterning lower electrodes so that the lower electrodes cover surfaces of the common wirings disposed between the lower electrodes and extend over lateral surfaces of the common wirings, on positions corresponding to respective pixels, (3) covering a whole surface of a substrate obtained in the process (2) by a first insulation film, (4) covering a whole surface of the first insulation film by a semiconductor layer and etching the semiconductor layer so as to pattern the semiconductor layer on a position corresponding to a gate electrode part, (5) covering a whole surface of a substrate obtained in the process (4) by a conductive layer and etching the conductive layer so as to pattern a signal line in a direction intersecting with the scanning lines and the common wirings and pattern a drain electrode and a source electrode that is electrically connected to the signal line in each of the pixels, (6) covering a whole surface of a substrate obtained in the process (5) by a second insulation film, (7) forming a contact hole on the second insulation film which is positioned on the drain electrode of each of the pixels, (8) covering a whole surface of a substrate obtained in the process (7) by a transparent conductive layer and etching the transparent conductive layer so as to pattern an upper electrode having a plurality of slits in each of the pixels, and electrically conducting the upper electrode and the drain electrode, and (9) disposing a substrate obtained in the process (8) and a color filter substrate opposed to each other and filling a space between the substrates with liquid crystal.

According to the method for manufacturing a liquid crystal display device according to the embodiment, a liquid crystal display device of the FFS mode which exhibits the above-described advantageous effects can be manufactured.

Additional features and advantages are described herein, and will be apparent from the following Detailed Description and the figures.

BRIEF DESCRIPTION OF THE FIGURES

FIG. 3 is a schematic sectional view taken along a III-III line of FIG. 2;

DETAILED DESCRIPTION

Figure 1:
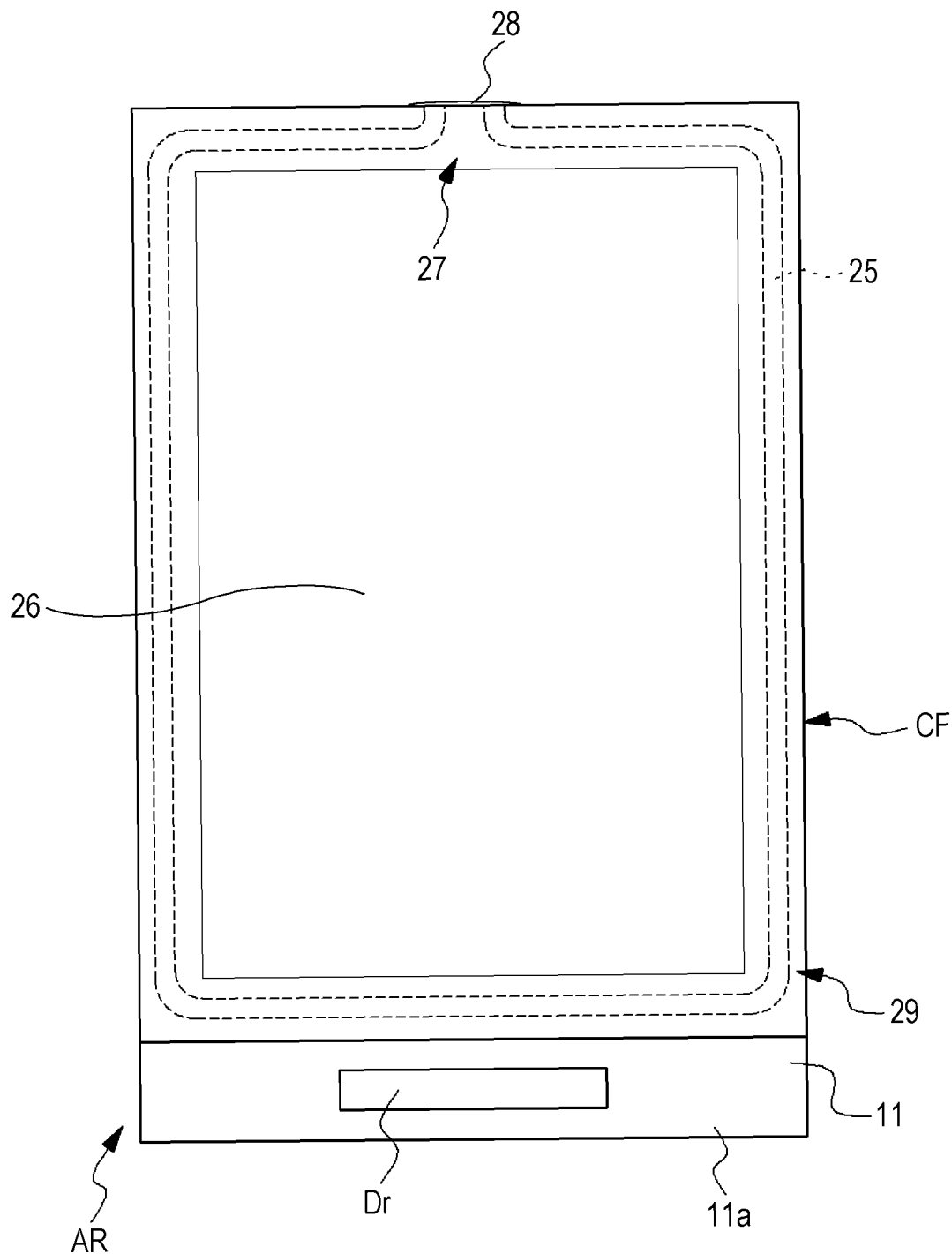
FIG. 1 is a plan view of a liquid crystal display device of a FFS mode according to an embodiment.

Embodiments of the present application will be described below in detail with reference to the drawings.

In respective drawings used for the description in this specification, scales of respective layers and respective members shown are adequately changed in the extent to which the layers and members can be recognized in the drawings, and thus the layers and the members are not necessarily shown in proportion to actual dimensions.

A liquid crystal display device 10 of the FFS mode according to an embodiment is described with reference to FIGS. 1 to 6B. The liquid crystal display device 10 according to the embodiment includes an array substrate AR, a color filter substrate CF, and a sealing member 25 which bonds the substrates AR and CF to each other as shown in FIG. 1. In the liquid crystal display device 10, liquid crystal (not shown) is injected into a region surrounded by the array substrate AR, the color filter substrate CF, and the sealing member 25 from a liquid crystal injection port 27 and the liquid crystal injection port 27 is sealed by a sealing member 28. In the liquid crystal display device 10, a region surrounded by the sealing member 25 constitutes a display region 26, and a region which is provided on the periphery of the display region 26 and in which an image is not recognized constitutes a non-display region 29 of the liquid crystal display device 10.

The array substrate AR is formed such that various kinds of wirings for driving the liquid crystal and the like are formed on a surface of a first transparent substrate 11 which is made of glass or the like and has a rectangular shape. The array substrate AR has the longer length in the longitudinal direction that the color filter substrate CF so as to have an extending part 11a which extends outward when the substrates AR and CF are bonded to each other. On the extending part 11a, a driver Dr which is composed of an IC chip, an LSI, or the like which outputs a driving signal is provided.

Figure 2:
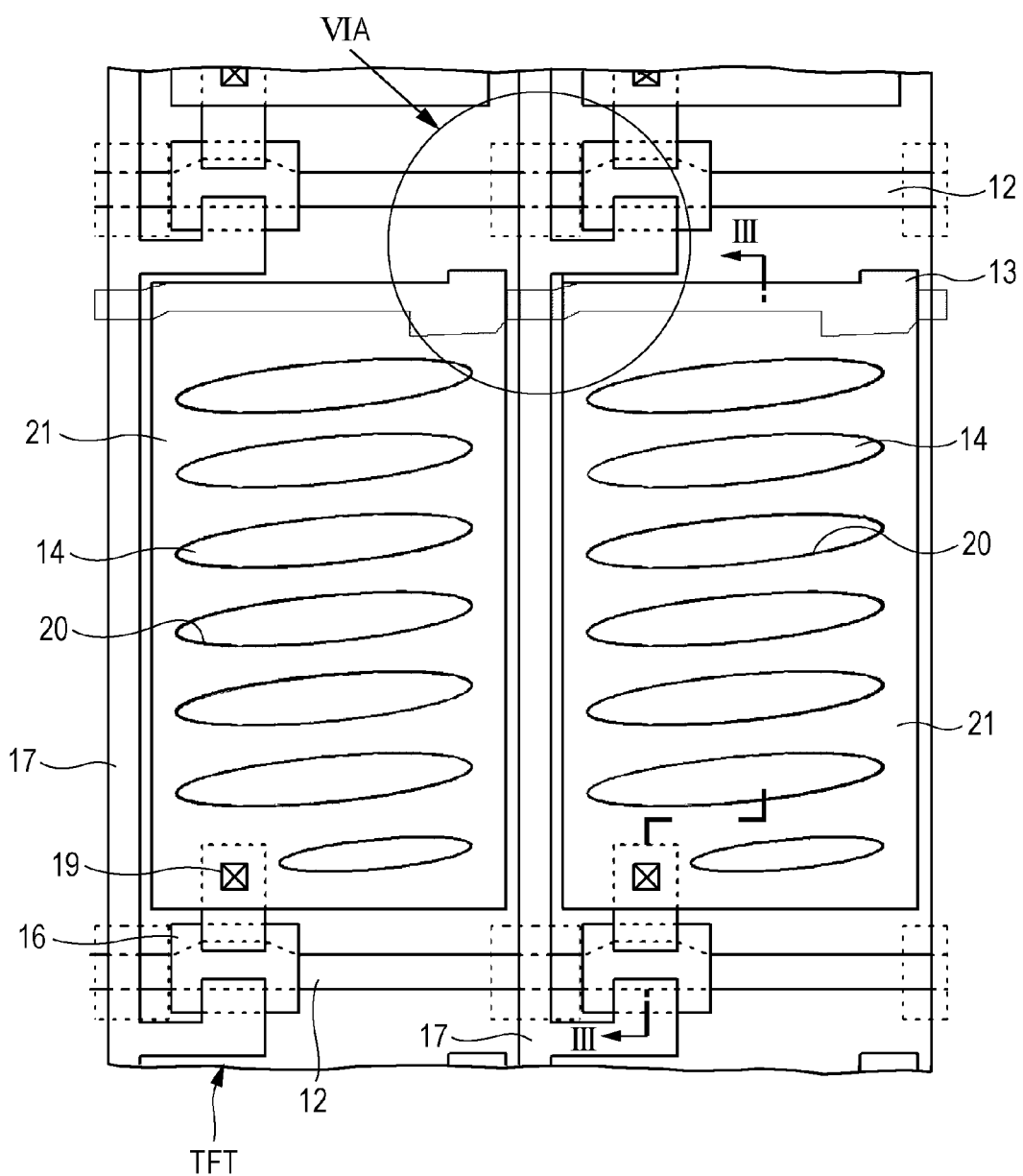
FIG. 2 is a plan view schematically showing a part, which corresponds to two pixels, of an array substrate of the liquid crystal display device of the FFS mode according to the embodiment.
Figure 4A:
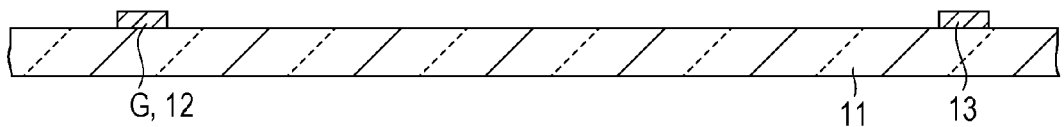
FIGS. 4A to 4F are sectional views of a part corresponding to the III-III line of FIG. 2 and sequentially showing a manufacturing process of the array substrate corresponding to one pixel of the embodiment.

On the array substrate AR of the liquid crystal display device 10 of the FFS mode of the embodiment, a plurality of scanning lines 12 and a plurality of common wirings 13 are formed on the whole surface of the transparent substrate 11 by photolithography or etching so as to be parallel with each other (refer to FIGS. 2 and 4A). Here, in the liquid crystal display device 10 of the embodiment, the common wiring 13 is disposed in a manner to be shifted to a side of one scanning line 12 so as to improve an aperture ratio and display image quality.

Figure 4B:
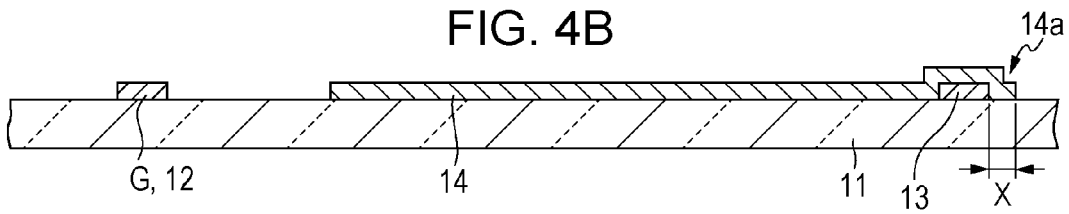
Figure 6A:
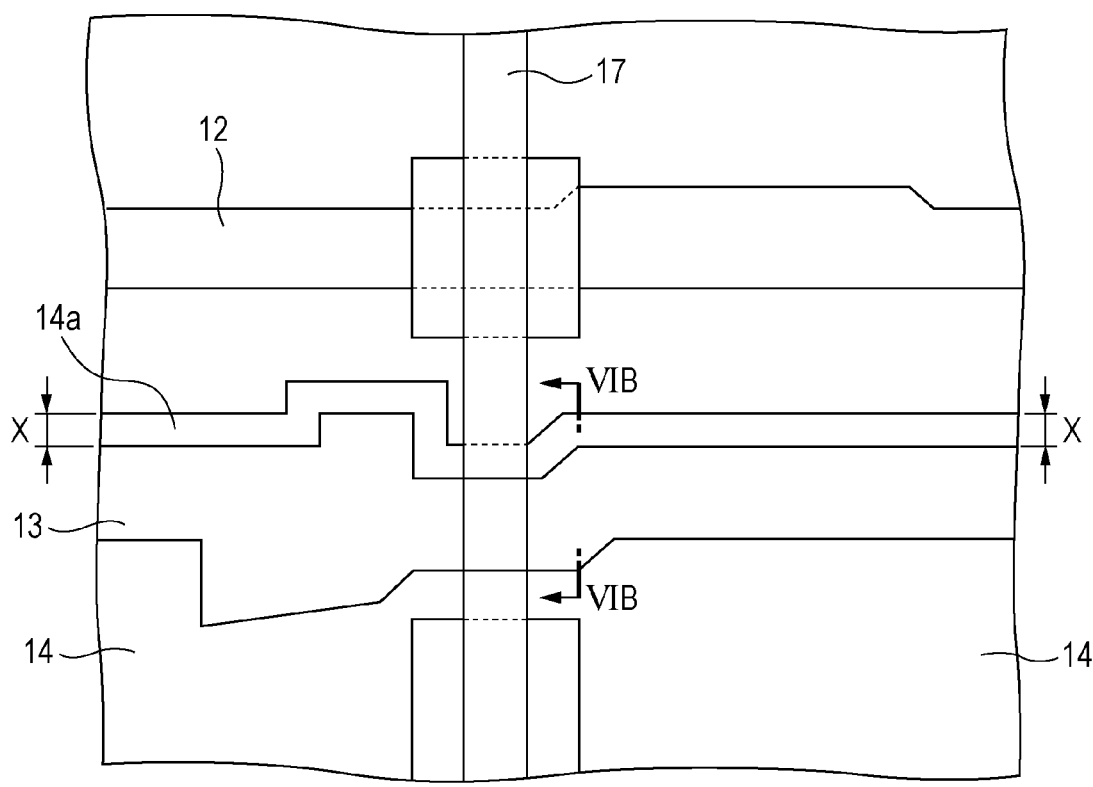
FIG. 6A is an enlarged plan view transparently showing a VIA part of FIG. 2 to a signal line.
Figure 6B:
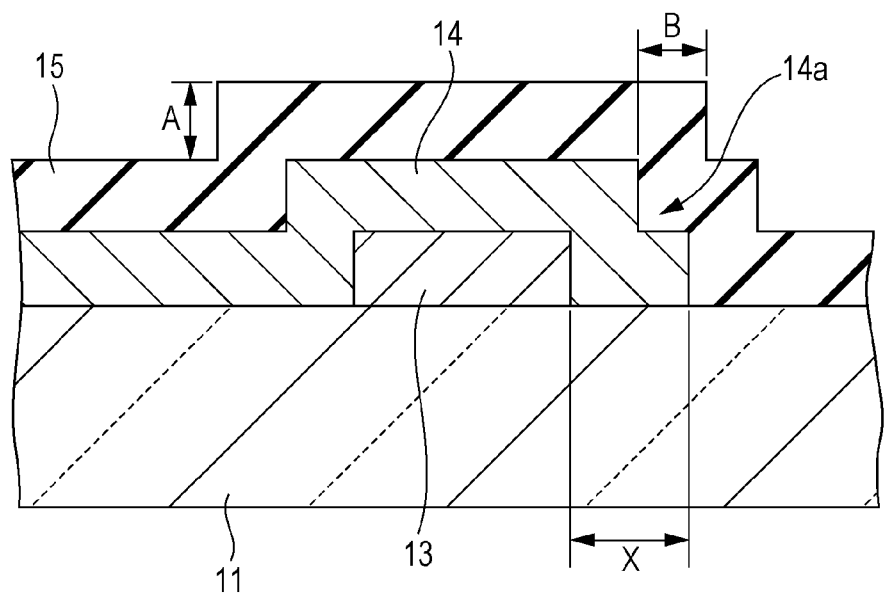
FIG. 6B is a sectional view taken along a VIB-VIB line of FIG. 6A.

Subsequently, the whole surface of the transparent substrate 11 on which the scanning lines 12 and the common wirings 13 are formed is covered by a transparent conductive layer made of indium tin oxide (ITO), indium zinc oxide (IZO), or the like and a lower electrode 14 is formed by photolithography or the like in the same manner. At this time, the lower electrode 14 covers surfaces of the common wirings 13 disposed between respective pixels, further, the lower electrode 14 covers the surfaces of the common wirings 13 so that a plurality of steps 14a having the width X are formed as shown in FIGS. 4B, 6A, and 6B. Here, a part of the lower electrode 14 is extended to a position to cover the scanning line 12 of an adjacent pixel, on a position on which the lower electrode 14 is overlapped with a signal line 17 when viewed from above.

Figure 4C:
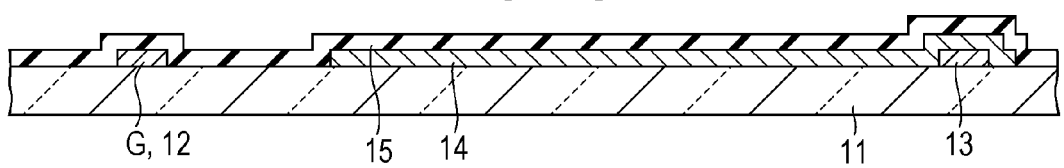

After the lower electrode 14 is formed in such way, a first insulation film 15 which is a silicon nitride layer is formed to cover the whole surface of the substrate (refer to FIG. 4C). At this time, since the first insulation film 15 is formed on the plurality of steps 14a formed on the lower electrode 14, a plurality of steps are formed on the first insulation film 15 as well.

Figure 4D:
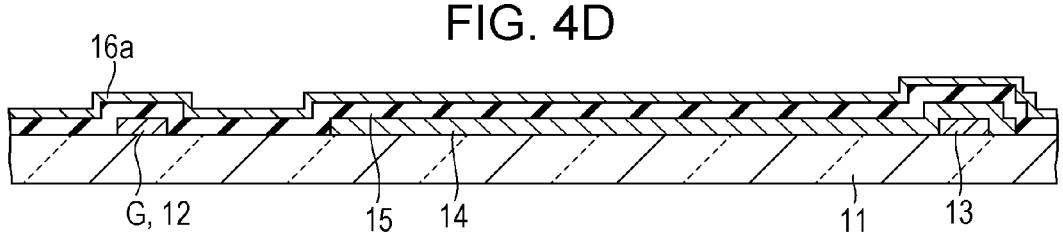
Figure 4E:
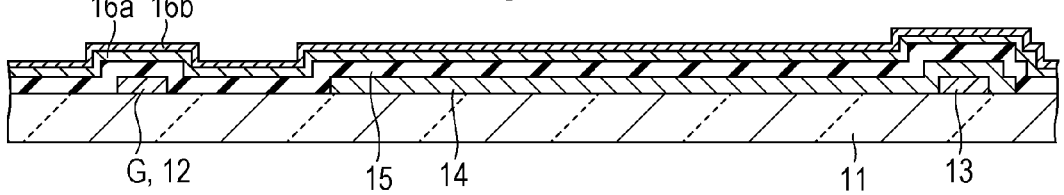
Figure 4F:
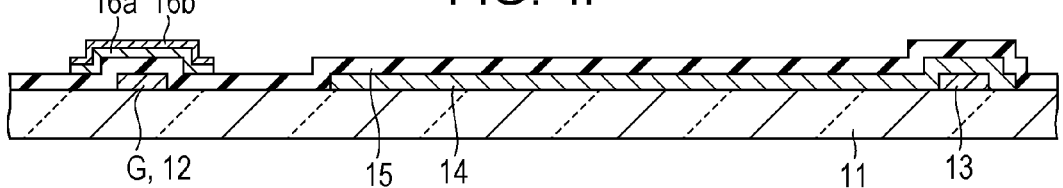

Subsequently, after the whole surface of the insulation film 15 is covered by an a-Si layer 16a and n+a-Si layer 16b, a semiconductor layer 16 composed of the a-Si layer 16a and the n+a-Si layer 16b is formed in a TFT forming region by photolithography or the like in the same manner (refer to FIGS. 4D to 4F). A region, which corresponds to a position on which the semiconductor layer 16 is formed, of the scanning line 12 constitutes a gate electrode G of a TFT.

Figure 5A:
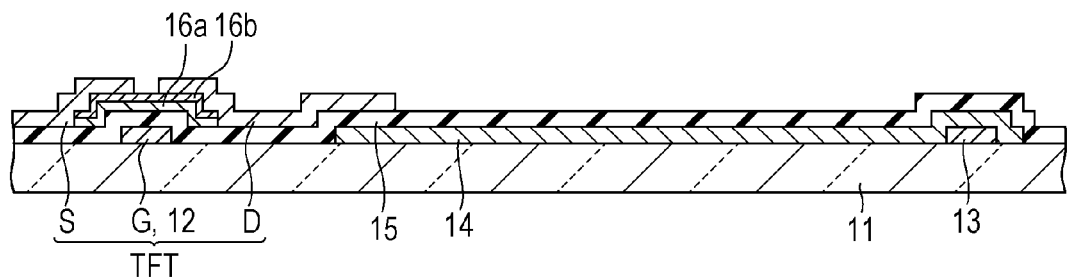
FIGS. 5A to 5C are sectional views sequentially showing the manufacturing process, which follows the process of FIGS. 4A to 4F, of the array substrate corresponding to of one pixel of the embodiment.

Then, the whole surface of the transparent substrate 11 on which the semiconductor layer 16 is formed is covered by a conductive layer, and the signal line 17 and a drain electrode D are formed also by photolithography or the like (refer to FIG. 5A). Both of a source electrode S part and a drain electrode D part of the signal line 17 are partially overlapped with the surface of the semiconductor layer 16.

Figure 7A:
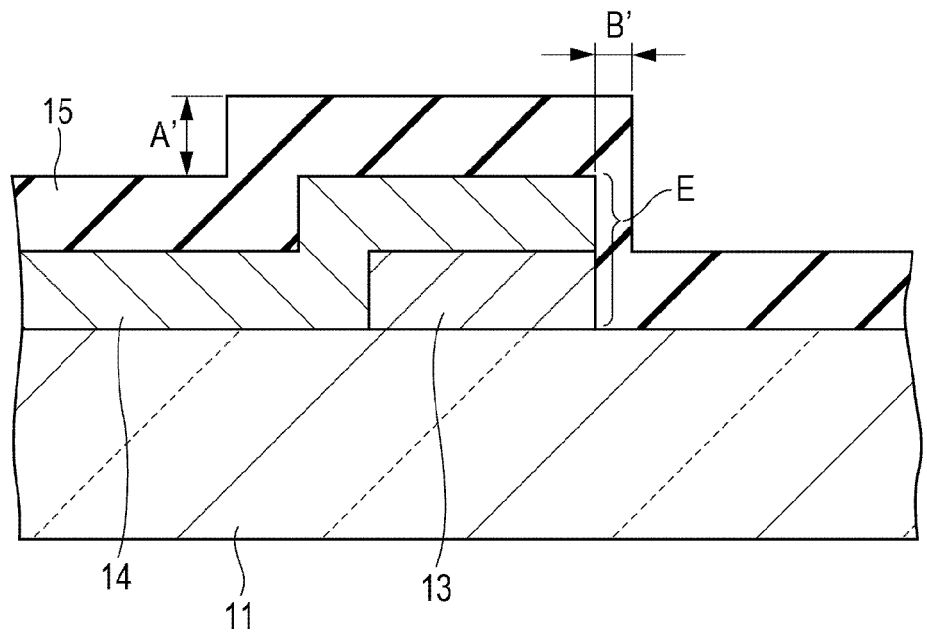
FIG. 7A is a sectional view of a related art example corresponding to FIG. 6B.

Here, a case of the embodiment and a case of a related art example are compared and explained with reference to FIGS. 7A to 8B. A process shown in FIG. 4F includes a process of cleaning the substrate by pure water WT after the semiconductor layer 16b is formed. In the related art example, the lower electrode 14 has an edge part E and the first insulation film 15 is formed on the lower electrode 14 as shown in FIG. 7A, so that the thickness B' of the first insulation film formed on the edge part E is smaller than the thickness A' of a flat part of the first insulation film 15, degrading a step coverage (B'/A') of the first insulation film 15 formed on the common wiring 13.

Figure 7B:
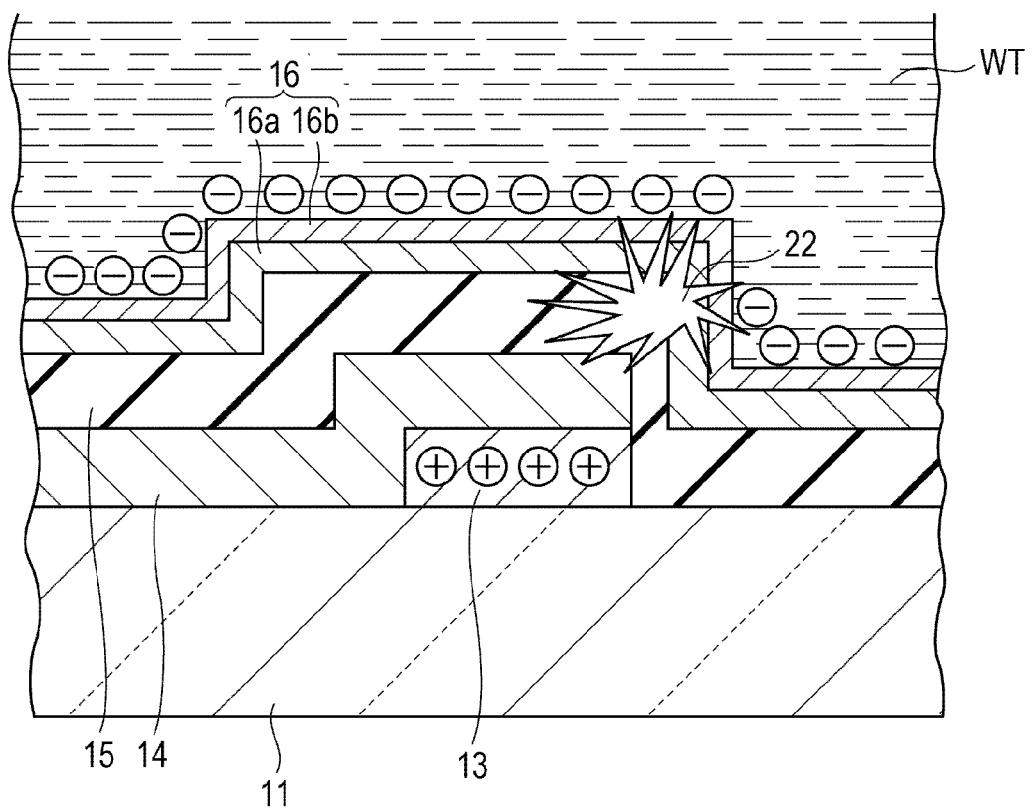
FIG. 7B is a sectional view showing a spark state.
Figure 8A:
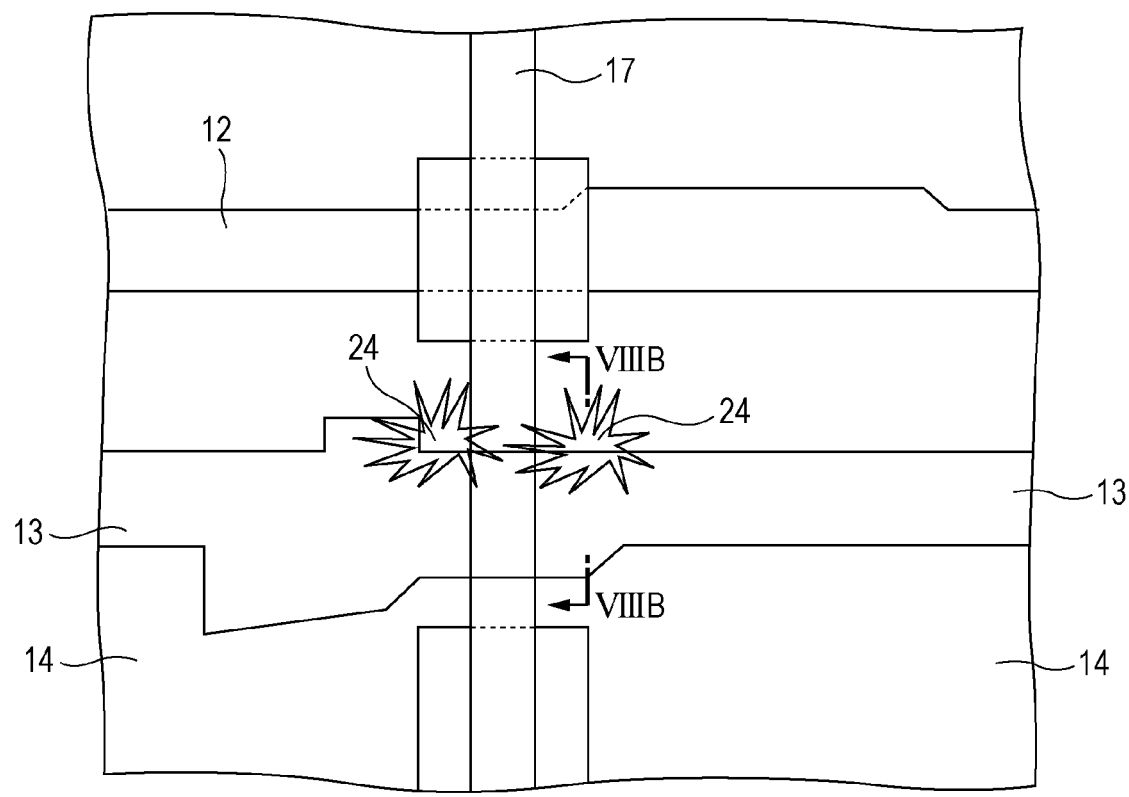
FIG. 8A is a plan view showing a short-circuiting state of the related art example and corresponding to FIG. 6A.
Figure 8B:
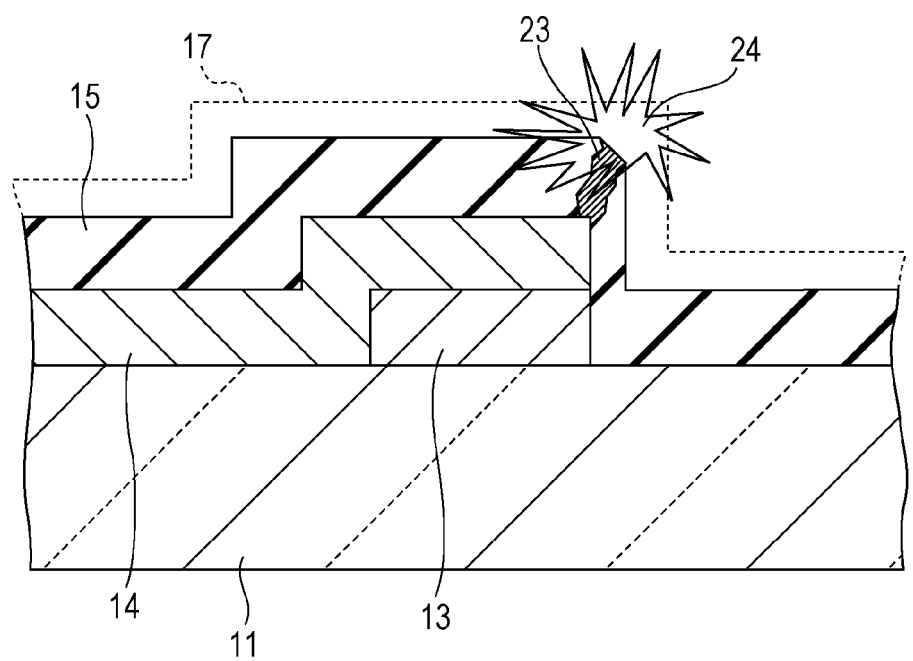
FIG. 8B is a sectional view taken along a VIIIB-VIIIB line of FIG. 8A.

At this time, the semiconductor layer 16 is formed also on the surface of the first insulation film 15 which is formed on the common wiring 13 as shown in FIG. 7B and the substrate is cleaned in this state. Therefore, during the cleaning by the pure water WT, static electricity generated by friction between the pure water WT and the n+a-Si layer 16b travels through the n+a-Si layer 16b and the a-Si layer 16a and causes a spark 22 with the lower electrode 14 which is formed on the common wiring 13. Accordingly, the first insulation film 15 which is thinly formed on the lower electrode 14 is broken and thus a damage 23 is disadvantageously formed (refer to FIG. 8B). Then, if the signal line 17 is formed on the first insulation film 15 while leaving the damage 23 in the first insulation film 15 in the process shown in FIG. 4F, a source layer enters the damage 23, which is formed when the first insulation film 15 is broken, in a source layer formation. Accordingly, short-circuiting between the signal line 17 and the lower electrode 14 occurs to cause a line defect.

In the embodiment, the lower electrode 14 is formed to cover the common wirings 13 and have a plurality of steps 14a having the width X, as shown in FIGS. 6A and 6B. Then, the first insulation film 15 is formed to cover the steps 14a. Thus, the first insulation film 15 is formed such that the thickness A of the flat part and the thickness B of the step 14a are approximately same as each other. Accordingly, the step coverage (B/A) of the first insulation film 15 in this step part is improved, namely, the first insulation film 15 is formed thicker than that of the related art example. Therefore, dielectric strength against static electricity is improved, and breaking of the first insulation film 15 caused by static electricity generated during cleaning by the pure water WT is suppressed. As a result, short-circuiting 24 between the lower electrode 14 and the signal line 17 can be suppressed.

In the embodiment, a part of the lower electrode 14 is extended to a position on which the lower electrode 14 covers the scanning line 12 of an adjacent pixel, on a position overlapping with the signal line 17 when viewed from above. Therefore, the above-described advantageous effect generated between the signal line 17 and the common wiring 13 can be expected also between the signal line 17 and the scanning line 12. Accordingly, in the embodiment, the short-circuiting which may occur between the signal line 17 and the scanning line 12 can also be suppressed.

Figure 5B:
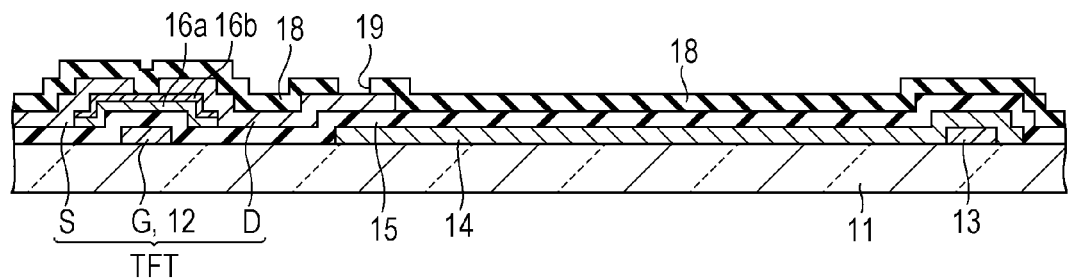
Figure 5C:
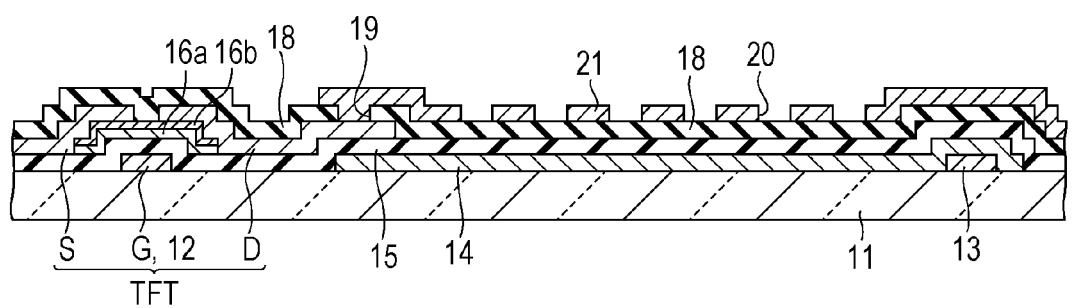

Subsequently, in order to complete the liquid crystal display device 10 of the embodiment, after the whole surface of this substrate is covered by a second insulation film 18 which is a silicon nitride layer, a contact hole 19 is formed on the second insulation film 18 on a position corresponding to the drain electrode D so as to expose a part of the drain electrode D (refer to FIG. 5B). Further, a transparent conductive layer made of ITO or the like is formed to cover the whole surface, and an upper electrode 21 including a plurality of slits 20, which are parallel to each other, is formed on a part, which is surrounded by the scanning line 12 and the signal line 17, of the second insulation film 18 also by photolithography or the like so as to have a pattern shown in FIG. 2 (refer to FIG. 5C). The slits 20 are used for generating a fringe field effect. The upper electrode 21 is electrically connected with the drain electrode D via the contact hole 19, so that the upper electrode 21 functions as a pixel electrode.

Then, by forming a predetermined alignment film (not shown) is formed over the whole surface, the array substrate AR is completed. The array substrate AR manufactured as described above and the color filter substrate which is separately manufactured are faced to each other, then the peripheries of the substrates are bonded to each other with the sealing member 25, and a space formed between the substrates is filled with liquid crystal. Accordingly, the liquid crystal display device 10 of the FFS mode according to the embodiment is obtained. The detailed description of the color filter substrate CF is omitted, but the color filter substrate CF has the substantially same configuration as that of a liquid crystal display device of a twisted nematic (TN) mode of the related art except that a color filter layer, an overcoat layer, and an alignment film are layered on a surface of the transparent substrate made of glass or the like and no common electrode is provided.

According to the liquid crystal display device of the FFS mode of the embodiment which is manufactured as described above, the first insulation film having favorable step coverage is formed on the surface of the lower electrode, so that breaking of the first insulation film due to static electricity is suppressed. As a result, short-circuiting between the lower electrode and the signal line can be suppressed and accordingly, a highly reliable liquid crystal display device can be provided.

In the example of the embodiment, the steps of the lower electrode are formed on the whole surface along the common wiring. However, the steps may be formed only near a position on which short-circuiting easily occurs, for example, a position on which the common wiring and the signal line intersect with each other. Accordingly, short-circuiting between the lower electrode and the signal line can be prevented and therefore a liquid crystal display device of the FFS mode with superior display quality can be provided.

It is favorable to set the width X of the plurality of steps of the lower electrode to be 2.25 µm or more so as to be able to form the first insulation film with sufficient thickness. The thickness of the lower electrode is approximately 0.1 µm, while the thickness of the first insulation film which is called a gate insulation film should be approximately 0.4 µm commonly. By setting the width X of the plurality of steps of the lower electrode to be 2.25 µm or more, even if variety of the line width of the signal line or pattern misalignment is taken into consideration, the first insulation film which is formed on the lower electrode can be set to have the thickness by which dielectric breakdown due to static electricity can be sufficiently suppressed also on the lateral surface of the step part. If the width X of the plurality of steps of the lower electrode is smaller than 2.25 µm, short-circuiting between the lower electrode and the signal line more frequently occurs disadvantageously.

It is preferable that a measuring part of the film thickness A of the flat part of the first insulation film which is used for calculation of a value of the step coverage (B/A) in the embodiment be the center of the flat part of the step uppermost part or the flat part of the step periphery, and it is preferable that a measuring part of the film thickness B of the lateral surface region be the thinnest part of the step part. Accordingly, a value of the step coverage (B/A) can be accurately calculated.

It is favorable that the value of the step coverage (B/A) which is a ratio of the film thickness A of the first insulation film and the film thickness B of the lateral surface region in the embodiment is set to be 1 or more. Accordingly, the film thickness B of the lateral surface region is sufficiently thick compared to the film thickness A, substances for forming a film sufficiently remain also on the lateral surface region of the step part, and therefore, a metal film or an insulation film can be stably formed without generation of fine holes or an occurrence of cracks. Accordingly, sufficient dielectric pressure can be imparted to the first insulation film, so that the dielectric strength of the first insulation film can be increased and short-circuiting between the signal line and the common wiring can be more suppressed, being able to provide a liquid crystal display device in which an occurrence of a line defect is reduced. If the value of the step coverage (B/A) is less than 1, the film thickness B of the lateral surface region is small compared to the film thickness A of the flat part, substances for forming a film do not sufficiently remain on the lateral surface region of the step part as well, and fine holes or cracks are generated. Therefore, short-circuiting between the lower electrode and the signal line more frequently occurs disadvantageously.

Further, it is favorable that a dummy pixel is formed in the non-display region 29 of the liquid crystal display device of the embodiment and the step part of the lower electrode is formed on the dummy pixel. The dummy pixel is preferentially broken by static electricity and thus also has a function to prevent the static electricity from adversely affecting the pixel within the display region. Therefore, the dummy pixel can prevent the static electricity from adversely affecting the pixel in the display region as long as the dummy pixel functions properly, being able to provide a further highly reliable liquid crystal display device.

It should be understood that various changes and modifications to the presently preferred embodiments described herein will be apparent to those skilled in the art. Such changes and modifications can be made without departing from the spirit and scope and without diminishing its intended advantages. It is therefore intended that such changes and modifications be covered by the appended claims.

The application is claimed as follows:

1. A liquid crystal display device, comprising:
   a pair of substrates that sandwich and hold a liquid crystal layer and of which one substrate is provided with, a plurality of scanning lines and a plurality of common wirings, the scanning lines and the common wirings being provided parallel with each other, a first insulation film that covers the scanning lines, the common wirings, and the one substrate, a plurality of signal lines that are provided on the first insulation film in a direction intersecting with the scanning lines and the common wirings, a thin film transistor that is provided near an intersection part of the scanning lines and the signal lines, a lower electrode that is formed below the first insulation film and is connected to the common wirings, a second insulation film that is formed on surfaces of the thin film transistor, the signal lines, and the first insulation film, and an upper electrode that is formed on the second insulation film to overlap with the lower electrode when viewed from above and has a slit;

a display region in which the liquid crystal layer is driven by an electric field generated between the lower electrode and the upper electrode; and a non-display region that is formed outside the display region;

wherein each of the common wirings is provided on a side of, and spaced a distance apart from, one of the scanning lines, wherein the lower electrode covers the common wirings in a manner that a plurality of steps are formed on at least one lateral surface of the common wiring, and wherein a dummy pixel is formed in the non-display region, and the step part of the lower electrode is formed in the dummy pixel.

2. The liquid crystal display device according to claim 1, wherein a width of a step part of the lower electrode is 2.25 µm or more from the lateral surface of the common wirings.

3. The liquid crystal display device according to claim 1, wherein the step part of the lower electrode is formed only near a position on which the common wirings and the signal lines intersect with each other.

4. The liquid crystal display device according to claim 1, wherein the first insulation film is formed such that when a thickness of an insulation film formed on a flat part on the lower electrode is denoted as A and a thickness of an insulation film formed on a lateral surface of the steps of the lower electrode is denoted as B, a step coverage of the first insulation film satisfies a relationship of $B/A \geq 1$.

* * * * *